(12) United States Patent
Turvey

(10) Patent No.: US 7,109,797 B1
(45) Date of Patent: Sep. 19, 2006

(54) METHOD AND APPARATUS FOR MEASURING THE COMMON-MODE COMPONENT OF A DIFFERENTIAL SIGNAL

(75) Inventor: Anthony E. Turvey, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 25 days.

(21) Appl. No.: 10/696,309

(22) Filed: Oct. 28, 2003

(51) Int. Cl.
*H03F 3/45* (2006.01)
(52) U.S. Cl. .................. 330/258; 330/330; 330/260
(58) Field of Classification Search .............. None
See application file for complete search history.

(56) References Cited

U.S. PATENT DOCUMENTS

| | | | | |
|---|---|---|---|---|
| 4,904,953 A | * | 2/1990 | McCormack | 330/258 |
| 4,992,755 A | * | 2/1991 | Seevinck et al. | 330/258 |
| 5,319,316 A | * | 6/1994 | Fensch | 330/253 |
| 6,281,699 B1 | | 8/2001 | Bishop | 324/765 |
| 6,781,451 B1 | * | 8/2004 | Kwan et al. | 330/258 |

\* cited by examiner

*Primary Examiner*—Khanh Van Nguyen
(74) *Attorney, Agent, or Firm*—Koppel, Patrick & Heybl

(57) ABSTRACT

A common-mode detector includes a first difference amplifier that is connected to compare a first input voltage with a feedback voltage to provide a first result, a second difference amplifier that is connected to compare a second input voltage with the feedback voltage to provide a second result, and a feedback amplifier that is connected to drive the feedback voltage to a level that is substantially the average of the first and second input voltages in response to receiving the first and second results.

15 Claims, 3 Drawing Sheets

METHOD AND APPARATUS FOR MEASURING THE COMMON-MODE COMPONENT OF A DIFFERENTIAL SIGNAL

BACKGROUND OF THE INVENTION

1. Field of the Invention

This invention relates to electronic systems and, more particularly, to common-mode detectors.

2. Description of the Related Art

Automatic test equipment (ATE) is used to test electric circuits prior to completing their manufacture. Although differential component detectors are relatively common in ATE, the use of common-mode detectors is relatively new. One such common-mode detector is described by C. Bishop in U.S. Pat. No. 6,281,699. A window comparator generates an output indicative of whether the common-mode signal is above, within, or below predetermined thresholds to determine a common-mode component. Two buffers and a resistor pair are provided with the window comparator to extract the common-mode signal and reduce loading effects on input signals from a device under test (DUT).

Unfortunately, a substantial current can flow through the resistor pair when the comparator's input signals are separated by a large differential voltage. Thus, the buffers should be designed to source and sink the maximum expected current that can flow. Additionally, the resistors must be made low in value in order to operate the circuit with high bandwidth. This adds to the problem of excessive current flow and can also cause significant nonlinearity in the response of the buffers.

There still exists a need, therefore, for a common-mode detector that does not suffer from large currents resulting from large input differential voltages and which does not suffer from high output impedance that precludes high bandwidth operation.

SUMMARY OF THE INVENTION

A common-mode detector is disclosed for determining the common-mode component of a differential signal. It includes a first difference amplifier that is connected to compare a first input voltage, preferably a noninverted component of the differential signal, with a feedback voltage to provide a first result. A second difference amplifier is connected to compare a second input voltage, preferably an inverted component of the differential signal, with the feedback voltage to provide a second result. A feedback amplifier is connected to drive the feedback voltage to a level that is substantially the average of the first and second input voltages in response to receiving the first and second results.

In one embodiment, a method is described for detecting the common-mode component. A voltage difference between the noninverted component of the differential signal and a feedback signal is converted to a first differential current signal. A voltage difference between the inverted component of the differential signal and the feedback signal is converted to a second differential current signal. The first and second differential current signals are compared to generate the feedback signal, which settles to a voltage indicative of the common-mode component of the differential signal.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

DETAILED DESCRIPTION OF THE INVENTION

A common-mode detector, in one embodiment, has two difference amplifiers for comparing each component of a differential signal to a feedback voltage. Each difference amplifier outputs a differential result that varies with the voltage difference between its respective differential signal component and the feedback signal. A feedback amplifier compares first and second results to generate the feedback voltage that is indicative of the difference between the first and second voltages. The feedback voltage is driven by the feedback amplifier to a voltage representing the common-mode component of the differential signal.

Figure 1:
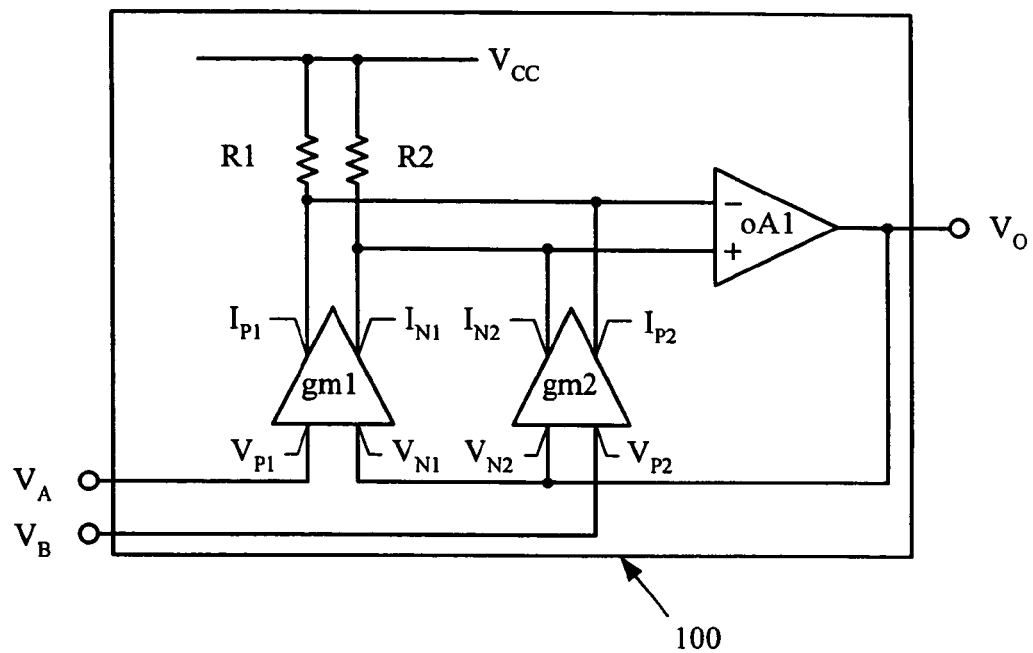
FIG. 1 is a block diagram of one embodiment of the invention with two differential amplifiers coupled to differential inputs $V_A$ and $V_B$, respectively, with their outputs coupled to an op-amp for feedback.

FIG. 1 illustrates a common-mode detector 100 that has, in one embodiment, two differential transconductance amplifiers and a feedback amplifier, preferably an operational amplifier (OA1), to generate a voltage proportional to the common-mode component of a differential signal. The noninverting and inverting components of the differential signal are received at input terminals $V_A$ and $V_B$, respectively, of the detector 100. A first input $V_{P1}$ of a differential transconductance amplifier gm1 is coupled to terminal $V_A$ to receive the noninverting component of the differential signal. A second input $V_{N1}$ of gm1 is coupled to the detector's output at terminal $V_O$ for feedback. A second differential transconductance amplifier gm2 has first and second inputs $V_{P2}$ and $V_{N2}$, with $V_{P2}$ coupled to terminal $V_B$ to receive the inverting component of the differential signal, and $V_{N2}$ coupled to terminal $V_O$ to receive feedback from the output of the detector 100. Consequently, both the gm1 and gm2 amplifiers receive feedback from terminal $V_O$ at one of their two input terminals, and each is provided with a respective input of the differential signal at respective input terminals $V_A$ and $V_B$. More particularly, gm1 is provided with the difference in voltage between terminals $V_A$ and $V_O$, while gm2 is provided with the difference in voltage between terminals VB and $V_O$ to form difference amplifiers.

On their output sides, gm1 and gm2 are coupled at their first outputs $I_{P1}$ and $I_{P2}$, respectively, to a high impedance inverting input of an op-amp OA1 and to a DC reference voltage, Vcc, through a load impedance R1. Current flows from $I_{P1}$ and $I_{P2}$ through R1 with the output currents from $I_{P1}$ and $I_{P2}$ each preferably equal to one-half of a bias current $I_O$ plus a current proportional to the difference in input voltages between the inputs of the associated amplifiers gm1 and gm2. More particularly, the current from $I_{P1}$ varies with the voltage difference between one side of the differential signal at terminal $V_A$ and the feedback signal from terminal $V_O$. The current from $I_{P2}$ varies with the voltage difference between the other side of the differential signal at terminal $V_B$ and the feedback signal from terminal $V_O$. The resulting voltage at the inverting input is indicative of the voltages between terminals $V_A/V_O$ and between $V_B/V_O$, respectively.

Second outputs $I_{N1}$, and $I_{N2}$ of gm1 and gm2, respectively, are coupled to a high impedance noninverting input of OA1. Both $I_{N1}$ and $I_{N2}$ are also coupled to a DC reference voltage ($V_{CC}$) through a second load impedance R2. Similar to $I_{P1}$ and $I_{P2}$, their output currents flow through R2 and the current for each of $I_{N1}$, and $I_{N2}$ varies with the difference in the input voltages on the input sides of gm1 and gm2, respectively. However, the resulting output currents for $I_{N1}$, and $I_{N2}$ are preferably equal to half the base line bias output current $I_O$ minus (rather than plus) a current proportional to the difference in voltages between the inputs of the associated amplifiers gm1 and gm2. The voltage at $I_{N1}$, and $I_{N2}$ is presented to the noninverting input for comparison to the voltage at the inverting input. Each of the outputs of gm1 and gm2 ($I_{P1}$, $I_{N1}$ and $I_{N2}$, $I_{P2}$, respectively) are characterized by equations (1) and (2), $$I_P = I_O/2 + \alpha(V_P - V_N) \quad (1)$$

$$I_N = I_O/2 - \alpha(V_P - V_N) \quad (2)$$

where α is a gain coefficient associated with the gm1 and gm2 amplifiers. α is either a fixed gain coefficient or a variable coefficient that, for a differential transconductance amplifier implemented with an ideal bipolar differential pair, is characterized by equation (3), $$\alpha = [(I_O/Vt)*\exp(-Vd/Vt)]/[1+\exp(-Vd/Vt)]^2 \quad (3)$$

where Vt is the thermal voltage (kT/q), k is the boltzmann constant, q is electron charge, T is temperature in Kelvin, and Vd is equal to Vp−Vn. The output voltage at terminal $V_o$ settles at a voltage between the differential input voltages at terminals $V_A$ and $V_B$ in response to receiving the results of the voltage comparison between $V_A$ and $V_B$ with $V_O$.

Figure 2:
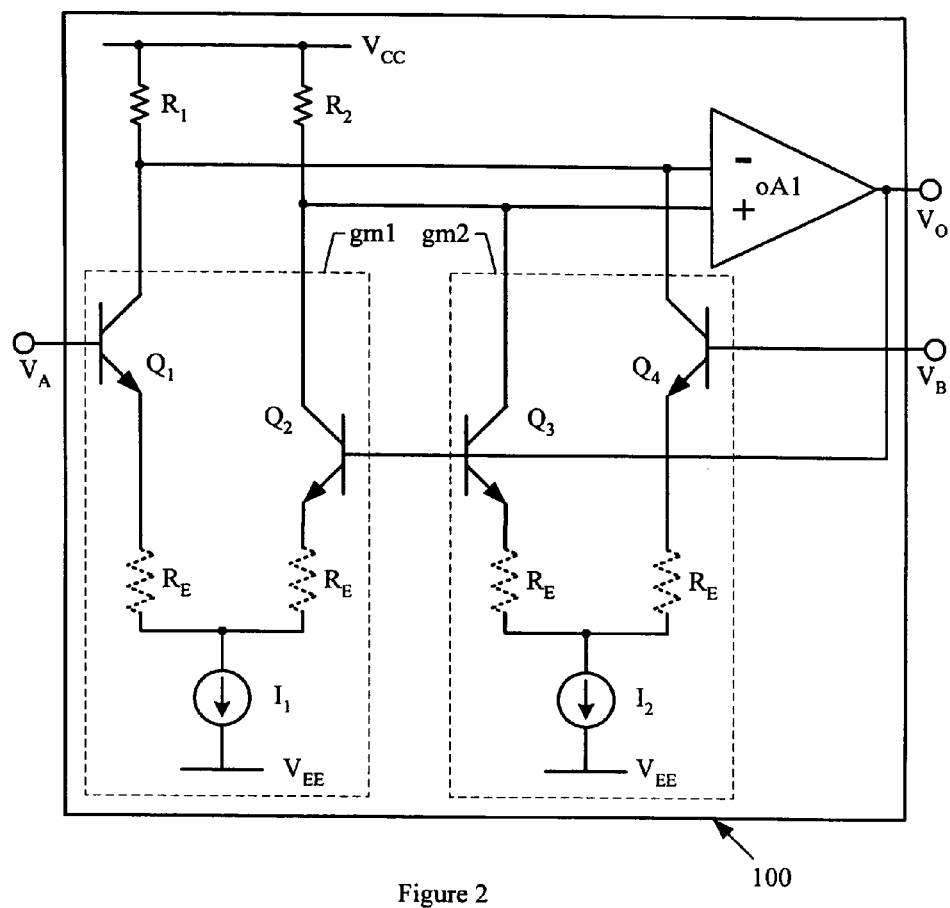
FIG. 2 is a schematic illustrating one implementation of the circuit illustrated in FIG. 1, which has two transistor pairs for implementing the differential amplifiers.

FIG. 2 is an implementation of the embodiment illustrated in FIG. 1, which has two NPN differential pair transistors Q1/Q2 and Q3/Q4 to implement gm1 and gm2, respectively. The differential pairs Q1/Q2 and Q3/Q4 are coupled to terminals $V_A$ and $V_B$, respectively, at bases of Q1 and Q4, respectively, so that each differential pair receives one component of the differential signal. Bases of Q2 and Q3 are both coupled to the output of oA1 so that each differential pair receives one component of the differential signal for comparison against feedback from oA1. In the first differential pair Q1/Q2, emitters for Q1 and Q2 are coupled to a low voltage supply bus $V_{EE}$ through a current source I2. Similarly, emitters for Q3 and Q4 in the second differential pair are coupled to $V_{EE}$ through a current source $I_2$. Emitter degeneration resistors RE can also be provided between the low voltage supply bus $V_{EE}$ and each of the emitters for Q1, Q2, Q3 and Q4 to reduce the gain and improve the linearity of the differential pairs Q1/Q2 and Q3/Q4.

Output collectors for Q2 and Q3 are coupled to $V_{CC}$ through impedance R2 so that the voltage at the noninverting input of OA1 is determined by the value of the R2 resistor multiplied by the sum of Q2 and Q3 currents. Similarly, the output collectors for Q1 and Q4 are coupled to a positive DC reference voltage through impedance R1 so that the voltage at the inverting input of OA1 is determined by the value of resistor R1 multiplied by the sum of the Q1 and Q4 currents. Preferably, the impedances R1 and R2 are equal, so that the voltages at the inverted and noninverted inputs of OA1 are the same when the sum of the Q2 and Q3 currents matches the sum of the Q1 and Q4 currents.

The current sources $I_1$ and $I_2$ are preferably matched so that an equal voltage differential between the bases of Q1/Q2 and those of Q3/Q4 produces voltages at the inverting and non-inverting inputs of oA1 that are substantially equal to one another. The equal voltage differentials are accomplished by oA1 driving its output at terminal $V_O$ to a voltage centered approximately between the inputs of $V_A$ and $V_B$. Such a voltage is approximate to the average or common-mode voltage $V_{CM}$ so that the output at terminal $V_O$ settles at a voltage indicative of the common-mode component of the differential signals.

For a common-mode detector designed for a differential voltage across $V_A$ and $V_B$ of between −1.0 V and 1.0 V, and a common-mode voltage $V_{CM}$ between −1.0 V and +1.0 V, the components could the following values:

R1, R2=1 Kohm $R_E$=100 ohm $I_1$, $I_2$=1 mA

Although the differential transconductance amplifiers are illustrated using NPN bipolar transistors, they could instead be implemented using any transconductance device, including (but not limited to) bipolar, metal oxide semiconductor (MOS) or junction field effect transistors (JFET).

Figure 3:
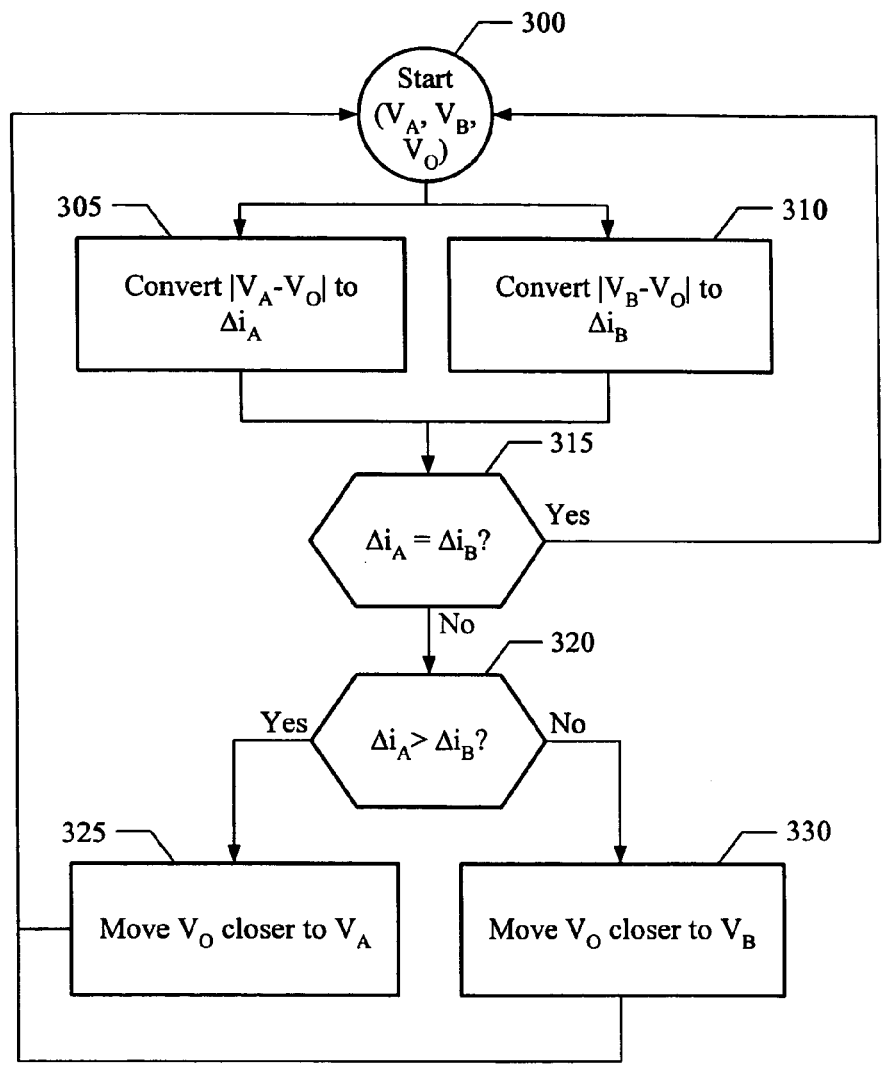
FIG. 3 is a flow diagram of an embodiment that compares input signals $V_A$ and $V_B$ to an output voltage $V_O$.

FIG. 3 is a logical flow diagram illustrating a method of detecting a common-mode component in a differential signal for a common-mode detector. The method begins with differential components $V_A$ and $V_B$ provided to the detector and with an output $V_O$ from the detector (block 300). The voltage of output $V_O$ is subtracted from the voltage of each differential component $V_A$ and $V_B$ to produce respective currents ΔiA and ΔiB (blocks 305, 310) that are indicative of the voltage difference at the respective inputs to each gm amplifier. More particularly, the voltage subtraction between $V_A$ and $V_O$ results in a current $\Delta i_A$ indicative of the difference in voltages for use by the detector. Similarly, the voltage comparison between $V_B$ and $V_O$ results in a current $\Delta i_B$. If $\Delta i_A$ is substantially equal to $\Delta i_B$ (block 315) then $V_O$ remains unchanged and the cycle starts back at the beginning (block 300). If $\Delta i_A$ is greater than $\Delta i_B$ (block 320) then the voltage level for output $V_O$ is moved closer to the voltage level for $V_A$ (block 325). In the embodiment illustrated in FIG. 2, a $\Delta i_A$ larger than $\Delta i_B$ would produce a larger voltage drop across R1 than across R2. The inverting input of the feedback amplifier would be presented with a smaller voltage than would the noninverting input, and thus the $V_O$ feedback signal would be driven toward $V_A$. If instead, $\Delta i_A$ is less than $\Delta i_B$ (block 320) then the voltage level for output $V_O$ is moved closer to the voltage level for $V_B$ (block 330). The process repeats with differential signals $V_A$ and $V_B$ and newly modified output $V_O$ (block 300). In this manner, the detector uses its own voltage output $V_O$ as feedback for comparison to the differential components $V_A$ and $V_B$.

Or, the common-mode detector can generate voltages $\Delta V_A$ and $\Delta V_B$, instead of currents $\Delta i_A$ and $\Delta i_B$, in response to comparing the voltages of $V_A$ and $V_B$ with the output voltage $V_O$. The voltages ΔvA and $\Delta v_B$ would be indicative of the difference in voltage between $V_A$ and $V_O$, and $V_B$ and $V_O$, respectively. $V_O$ would settle at a voltage level approximating the average of $V_A$ and $V_B$, which defines the common-mode voltage $V_{CM}$.

While various embodiments of the invention have been described in terms of a common-mode detector in an ATE, it will be apparent to those of ordinary skill in the art that many more embodiments and implementation are possible within the scope of this invention that are removed from an ATE, such as in other circuits requiring detection of the common-mode, or average, component of a differential signal. Accordingly, the invention should be limited only in terms of the appended claims.

I claim:

1. A common-mode detector, comprising:
   a first difference amplifier that is connected to compare a first input voltage with a feedback voltage to provide first and second differential current signals;
   a second difference amplifier that is connected to compare a second input voltage with said feedback voltage to provide third and fourth differential current signals;
   a feedback amplifier having inverting and non-inverting inputs, said feedback amplifier connected to receive said first and fourth differential current signals at said inverting input and said second and third differential currents at said non-inverting input to drive said feedback voltage to a level that is substantially the average of said first and second input voltages in response to receiving said first, second, third and fourth differential current signals.

2. The detector of claim 1, wherein said first and second difference amplifiers comprise:
   first and second differential transconductance amplifiers, respectively.

3. The detector of claim 2, wherein said first transconductance amplifier comprises:
   first and second outputs coupled to said inverting and non-inverting inputs, respectively, so that said first output provides current $I_P$ and said second output provides current $I_N$ according to $$I_P = I_O/2 + \alpha(V_P - V_N)$$

$$I_N = I_O/2 - \alpha(V_P - V_N)$$

wherein $I_O$ is a bias current, $V_P$ is said first input voltage, $V_N$ is said feedback voltage, $\alpha$ is a gain coefficient of said first differential transconductance amplifier and $I_P$ and $I_N$ comprise said first and second differential current signals, respectively.

4. A common-mode detector, comprising:
   an op-amp having inverting and non-inverting inputs and a detector output;
   first and second differential transconductance amplifiers, said differential transconductance amplifiers each having:
      a first input;
      a second input coupled to said detector output;
      a first output coupled to said inverting input; and
      a second output coupled to said non-inverting input;
   wherein, in response to receiving a differential signal at said first inputs, said common-mode detector is operable to provide a common-mode detector output indicative of a common-mode component of said differential signal.

5. The detector of claim 4, wherein said first differential transconductance amplifier further comprises:
   first and second transistors each having a collector coupled to said inverting and non-inverting inputs, respectively.

6. The detector of claim 5, further comprising:
   a first current source coupled to emitters of said first and second transistors.

7. The detector of claim 6, further comprising:
   an emitter degeneration resistor coupled between said current source and each of said emitters.

8. The detector of claim 4, further comprising:
   a first impedance coupled between a reference voltage and each of said inverting input and first outputs.

9. The detector of claim 8, further comprising:
   a second impedance coupled between said reference voltage and each of said noninverting input and said second outputs.

10. The detector of claim 9, wherein said first and second impedances comprise first and second resistors, respectively.

11. The detector of claim 4, wherein said first differential transconductance amplifier further comprises:
    first and second transistors with their output collectors coupled to said first and second outputs, respectively, and their bases to said first and second inputs, respectively;
    so that said first differential transconductance amplifier is operable to receive said detector output and a first side of said differential signal.

12. The detector of claim 11, wherein said second differential transconductance amplifier further comprises:
    third and fourth transistors with their output collectors coupled to said second and first outputs, respectively, and their bases to said second and first inputs, respectively;
    so that said second differential transconductance amplifier is operable to receive said detector output and a second side of said differential signal.

13. The detector of claim 12, further comprising:
    a current source coupled to emitters of said third and fourth transistors.

14. A method of measuring a common-mode component of a differential signal, comprising:
    converting a voltage differential between a non-inverting side of said differential signal and a feedback signal to generate a first differential current signal;
    converting a voltage differential between an inverting side of said differential signal and said feedback signal to generate a second differential current signal; and
    comparing said first and second differential current signals to generate said feedback signal, so that said feedback signal settles to a voltage indicative of the common-mode component of said differential signal.

15. The method of claim 14, wherein said comparing step comprises generating first and second voltages corresponding to said first and second differential current signals, and comparing said voltages to generate said feedback signal.

* * * * *